(12) United States Patent
Rokach et al.

(10) Patent No.: US 11,910,573 B2
(45) Date of Patent: Feb. 20, 2024

(54) MECHANICAL DEVICE FOR COOLING AN ELECTRONIC COMPONENT

(71) Applicant: Mellanox Technologies Ltd., Yokneam (IL)

(72) Inventors: Alon Rokach, Haifa (IL); Ayal Shabtay, Haifa (IL); David Fischer, Pardes Hanna-Karkur (IL); Nimer Hazin, Bi'ina (IL); Jamal Mousa, Haifa (IL)

(73) Assignee: MELLANOX TECHNOLOGIES LTD., Yokneam (IL)

( * ) Notice: Subject to any disclaimer, the term of this patent is extended or adjusted under 35 U.S.C. 154(b) by 111 days.

(21) Appl. No.: 17/509,233

(22) Filed: Oct. 25, 2021

(65) Prior Publication Data

US 2023/0125975 A1   Apr. 27, 2023

(51) Int. Cl.
*H05K 7/20* (2006.01)
*H05K 13/04* (2006.01)
*H05K 1/02* (2006.01)

(52) U.S. Cl.
CPC ........... *H05K 7/205* (2013.01); *H05K 1/0203* (2013.01); *H05K 13/04* (2013.01)

(58) Field of Classification Search
CPC .... H05K 1/0203; H05K 7/205; H05K 9/0024; H05K 9/0081; H05K 13/04
See application file for complete search history.

(56) References Cited

U.S. PATENT DOCUMENTS

| | | | |
|---|---|---|---|
| 6,301,107 B1 * | 10/2001 | Lev | G06F 1/203 361/689 |
| 2014/0209168 A1 * | 7/2014 | Zhamu | H01L 31/052 428/323 |
| 2015/0264842 A1 * | 9/2015 | Song | H01L 23/42 29/840 |
| 2018/0228063 A1 * | 8/2018 | Dixon | H01L 23/36 |
| 2018/0228065 A1 * | 8/2018 | Wrona | H01L 23/552 |
| 2019/0098802 A1 * | 3/2019 | Mokler | H05K 9/0028 |
| 2019/0254157 A1 * | 8/2019 | Kotlar | H05K 7/205 |
| 2021/0296264 A1 * | 9/2021 | Kubo | H01L 23/552 |

* cited by examiner

*Primary Examiner* — Adam B Dravininkas
(74) *Attorney, Agent, or Firm* — PEARL COHEN ZEDEK LATZER BARATZ LLP

(57) ABSTRACT

A mechanical device for cooling an electronic component may include a surface including an aperture, and a first support protruding from the surface and a second support protruding from the surface. In some embodiments, the device may include disposed within the aperture a thermal interface material (TIM).

15 Claims, 7 Drawing Sheets

100

100

MECHANICAL DEVICE FOR COOLING AN ELECTRONIC COMPONENT

FIELD OF THE INVENTION

The present invention relates to the field of devices for dissipating heat from heat-producing electronic components on Printed Circuit Boards, and more particularly, to mechanical devices for applying a thermal interface material to heat-producing electronic components on Printed Circuit Boards.

BACKGROUND OF THE INVENTION

A heat-producing electronic component on a Printed Circuit Board (PCB) may require cooling. Cooling of the heat-producing electronic component on the PCB is typically done using a device and/or a thermal interface material (TIM). When applied to the heat-producing electronic component, the TIM may unintentionally leak from the heat-producing electronic component onto the PCB and cover sensitive components on the PCB, such as, for example, paths for high-speed signals. Covering sensitive components with the TIM may cause reduction in their performance.

SUMMARY OF THE INVENTION

Some embodiments of the present invention may provide a mechanical device for cooling an electronic component, the device may include: a surface including an aperture; and a first support protruding from the surface and a second support protruding from the surface.

In some embodiments, the device may include, disposed within the aperture, a thermal interface material (TIM).

In some embodiments, the first support and the second support are at opposite sides of the aperture with respect each other.

In some embodiments, the first support and the second support are configured to contact at their free ends a Printed Circuit Board (PCB) to align the aperture with the electronic component.

In some embodiments, a shape of the aperture substantially corresponds to a shape of the electronic component.

In some embodiments, an area of the aperture is smaller than an area of the electronic component.

In some embodiments, a height of the first support and a height of the second support are greater than a height of the electronic component such that when the device is placed on the PCB, a gap is formed between the surface of the device and the electronic component.

In some embodiments, the gap is smaller than a grain size of the TIM.

In some embodiments, the device may include a material having greater thermal conductivity than the PCB.

Some embodiments of the present invention may provide an electronic assembly including: a Printed Circuit Board (PCB); an electronic component connected to the PCB; a device including: a surface including an aperture aligned with the electronic component, and a first support protruding from the surface and a second support protruding from the surface and placed at their ends on the PCB; and a thermal interface material (TIM) disposed within the aperture of the device.

In some embodiments, the first support and the second support of the device are at opposite sides of the aperture of the device with respect each other.

In some embodiments, a shape of the aperture of the device substantially corresponds to a shape of the electronic component.

In some embodiments, an area of the aperture of the device is smaller than an area of the electronic component.

In some embodiments, a height of the first support and a height of the second support of the device are greater than a height of the electronic component such that a gap is formed between the surface of the device and the electronic component.

In some embodiments, the gap is smaller than a grain size of the TIM.

In some embodiments, the TIM further covers at least a portion of the surface of the device.

In some embodiments, the device may include a material having greater thermal conductivity than the PCB.

Some embodiments of the present invention may provide a method of assembling an electronic assembly, the method may include: placing an electronic component on a Printed Circuit Board (PCB); providing a device including: a surface including an aperture configured to receive and hold in place a thermal interface material (TIM), and a first support protruding from the surface and a second support protruding from the surface; aligning the aperture in the surface of the device with the electronic component; and placing a free end of the first support and a free end of the second support of the device on the PCB.

Some embodiments may further include applying the TIM within the aperture of the device.

Some embodiments may further include applying the TIM to at least a portion of the surface of the device.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings.

Figure 1A:
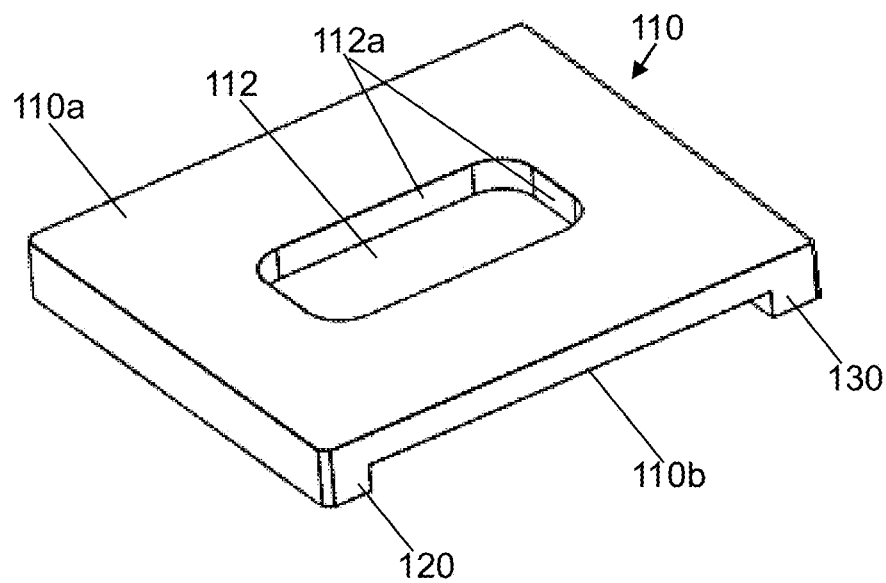
FIGS. 1A and 1B are three-dimensional (3D) diagrams of a mechanical device for cooling an electronic component, according to some embodiments of the invention.

It will be appreciated that, for simplicity and clarity of illustration, elements shown in the figures have not neces-

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Figure 1B:
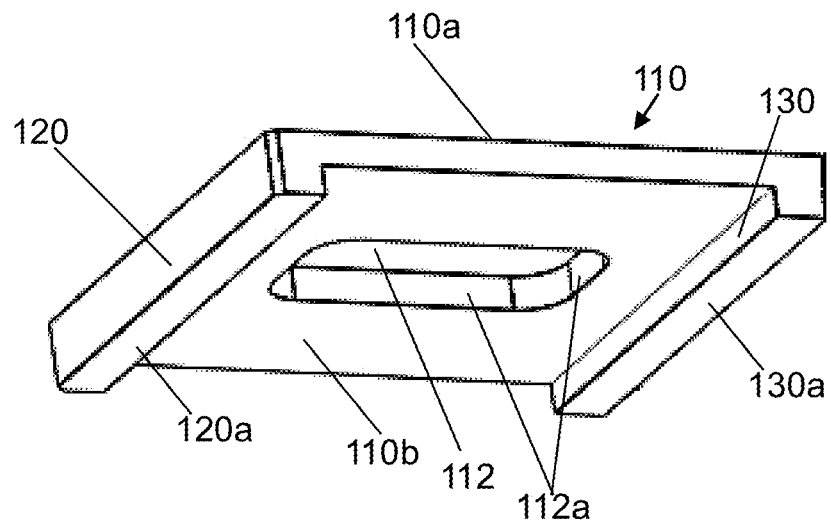

Reference is now made to FIGS. 1A and 1B, which are three-dimensional (3D) diagrams of a mechanical device 100 for cooling an electronic component, according to some embodiments of the invention.

Figure 1C:
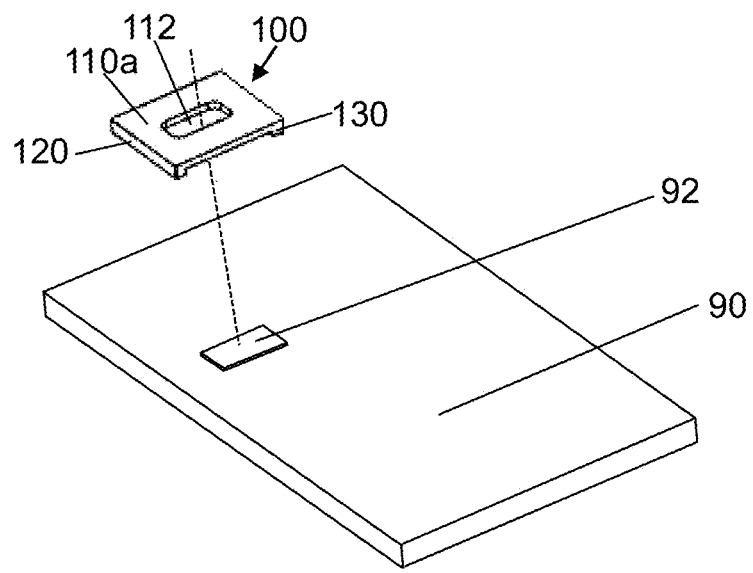
FIGS. 1C and 1D are 3D diagrams of the device and a Printed Circuit Board (PCB), according to some embodiments of the invention.
Figure 1D:
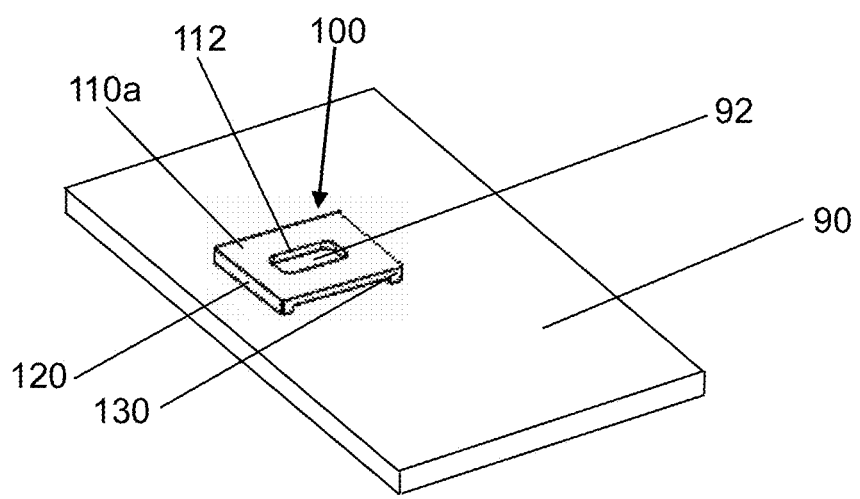

Reference is also made to FIGS. 1C and 1D, which are 3D diagrams of device 100 and a Printed Circuit Board (PCB) 90, according to some embodiments of the invention.

Figure 1E:
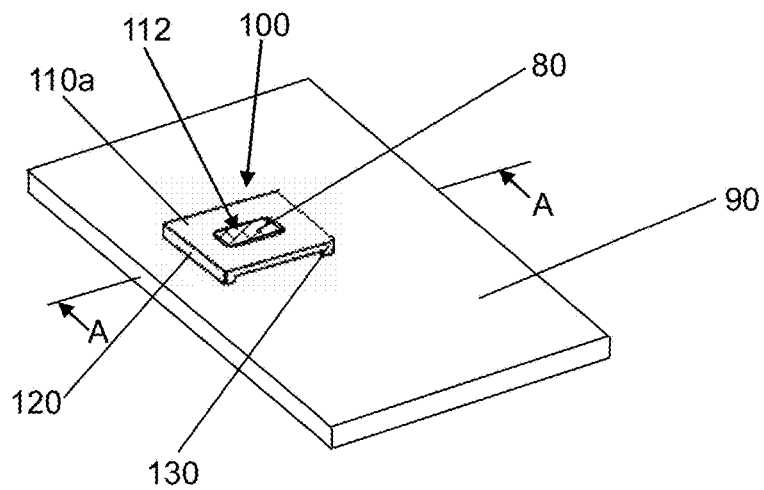
FIG. 1E is a 3D diagram of the device connected to or placed on the PCB and having a thermal interface material (TIM) disposed within an opening or aperture in a surface of the device, according to some embodiments of the invention.

Reference is also made to FIG. 1E, which is a 3D diagram of device 100 connected to or placed on PCB 90 and having a thermal interface material (TIM) 80 disposed within an opening or aperture 112 in a surface 110 of device 100, according to some embodiments of the invention.

Figure 1F:
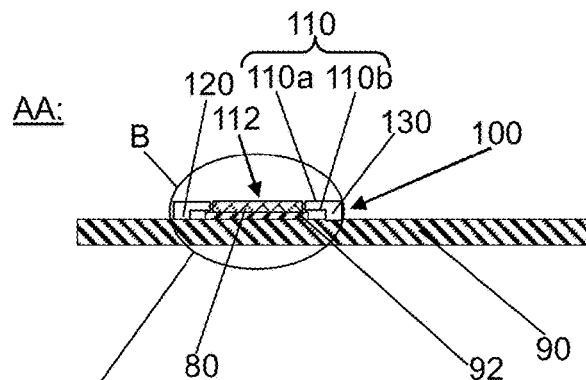
FIGS. 1F and 1G are cross-sectional views of the device connected to or placed on the PCB and having the TIM disposed within the opening or aperture in the surface of the device, according to some embodiments of the invention.
Figure 1G:
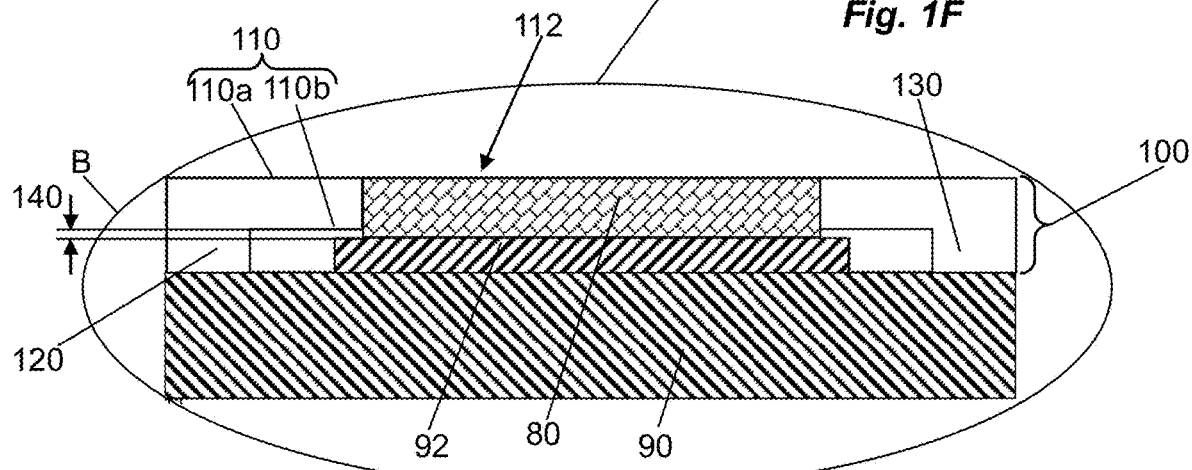

Reference is also made to FIGS. 1F and 1G, which are cross-sectional views of device 100 connected to or placed on PCB 90 and having TIM 80 disposed within opening or aperture 112 in surface 110 of device 100, according to some embodiments of the invention.

According to some embodiments of the present invention, device 100 may include a portion or surface 110 having an opening or aperture 112, and a first leg or support 120 and a second leg or support 130 protruding from surface 110 (e.g., as shown in FIGS. 1A, 1B, 1C, 1D, 1E, 1F and 1G). Device 100 may be formed of one piece. For example, device 100 may be a stamped piece of metal. Other examples of manufacturing of device 100 may include Computerized Numerical Control (CNC) manufacturing, Copper Metal Injection Molding (MIM-Cu) or any other manufacturing methods known in the art.

Device 100 may be connected to or placed on PCB 90 such that aperture 112 in surface 110 of device 100 is aligned (or substantially aligned) with an electronic component 92 (e.g., heat-producing electronic component) on PCB 90 (e.g., as shown in FIGS. 1C and 1D). For example, aligning may include ensuring aperture 112 partially covers, substantially covers or entirely covers part of a surface of electronic component 92 and/or ensuring that no part of aperture 112 is not covering part of electronic component 92. Aligning may be performed differently. Surface 110 may include an upper portion 110a (e.g., in contact with air and/or with a shell of an electronic assembly comprising device 100) and a lower portion 110b (e.g., facing electronic component 92). In some embodiments, upper portion 110a and lower portion 110b may be parallel (or substantially parallel) to each other, Upon connecting device 100 to or placing device 100 on PCB 90, TIM 80 may be applied (e.g., dispensed) within aperture 112 in surface 110 of device 100 to cover entire (or substantially entire) surface of electronic component 92 (e.g., as shown in FIGS. 1E, 1F and 1G). Aperture 112 may include side walls 112a perpendicular (or substantially perpendicular) to upper portion 110a and/or lower portion 110b of surface 110 such that aperture 112 with its side walls 112a may act as a container for TIM 80. Device 100 may be connected to PCB 90 and/or TIM 80 may be applied within aperture 112 in surface 110 of device 100 during, for example, a manufacturing process of PCB 90. Dimensions of aperture 112 in surface 110, and dimensions of first support 120 and second support 130 of device 100 may be predetermined to prevent unintentional leak of TIM 80 onto PCB 90 during/upon application of TIM 80 within aperture 112 (e.g., as described hereinbelow).

Device 100 and/or TIM 80 disposed within aperture 112 in surface 110 of device 100 and/or covering at least a portion of surface 110 of device 100 may cause heat to dissipate from electronic component 92 to cool electronic component 92. For example, heat may flow from electronic component 92 to TIM 80 and dissipate from TIM 80 to air and/or to a shell of an electronic assembly comprising device 100. In another example, e.g., if device 100 is made of a material having greater thermal conductivity than that of PCB 90 and/or electronic component 92 and/or TIM 80, heat may flow from electronic component 92 and/or from TIM 80 to device 100 and dissipate from device 100 and TIM 80 to air and/or to a shell of an electronic assembly comprising device 100.

Examples of TIM 80 may include Parker TC-50, Laird T putty 607, Honeywell HT7000 or any other materials known in the art. Examples of electronic components 92 may include Trans-Impedance Amplifier (TIA), Electro-Absorption Modulator Lasers (EML) driver or any other electronic components known in the art.

In some embodiments, surface 110 of device 100 may be flat (or substantially flat). In some embodiments, upper portion 110a of surface 110 is flat (or substantially flat). In some embodiments, lower portion 110b of surface 110 is flat (or substantially flat). Surface 110 may, for example, have a rectangular (or substantially rectangular) shape (e.g., as shown in FIGS. 1A, 1B, 1C, 1D and 1E), a circular (or substantially circular) shape, or other shapes known in the art.

Aperture 112 in surface 110 of device 100 may have a shape that corresponds (or substantially corresponds) to a shape of electronic component 92. For example, aperture 112 may have a rectangular (or substantially rectangular)

shape, a circular (or substantially circular) shape, or other shapes known in the art. While one aperture is shown, in some embodiments, surface 110 may include two or more apertures (e.g., as described below with respect to FIGS. 3A and 3B).

First support 120 and second support 130 may be connected to or placed on at their free ends 120a, 130a, respectively (e.g., ends that are not connected to surface 110) PCB 90 to align (or substantially align) aperture 112 in surface 110 of device 100 with electronic component 92 (e.g., as shown in FIGS. 1D, 1E, 1F and 1G). In some embodiments, first support 120 and second support 130 may be perpendicular (or substantially perpendicular) to surface 110 of device 100 (e.g., as shown in FIGS. 1A, 1B, 1C, 1D, 1E, 1F and 1G). In some embodiments, first support 120 and second support 130 may protrude from lower portion 110b of surface 110 of device 100. In some embodiments, first support 120 and second support 130 may be at opposite sides of aperture 112 in surface 110 of device 100 (e.g., as shown in FIGS. 1A, 1B, 1C, 1D, 1E, 1F and 1G). While two supports are shown, in some embodiments, one support (e.g., appropriately shaped) or more than two supports may be used (e.g., as described below with respect to FIGS. 3A and 3B).

Dimensions of aperture 112 in surface 110, and dimensions of first support 120 and second support 130 of device 100 may be predetermined to prevent unintentional leak of TIM 80 onto PCB 90 during/upon application of TIM 80 within aperture 112. In some embodiments, an area of aperture 112 may be smaller than the entire area of a top surface of electronic component 92. For example, a ratio of the area of aperture 112 to the entire area of the top surface of electronic component 92 may be smaller than one (1). In general, the ratio may be predefined based on a power consumption of electronic component 92. For example, the greater the power consumption of electronic component 92, the greater the ratio of the area of aperture 112 to the entire area of the top surface of electronic component 92. In some embodiments, a height of first support 120 and a height of second support 130 (which are typically, but not always, the same) may be greater than a height of electronic component 92 (the heights measured as the height above the PCB) such that when device 100 is connected to or placed on PCB 90, an opening or gap 140 is formed between a lower portion 110b of surface 110 of device 100 and electronic component 92 (e.g., as shown in FIG. 1G). In some embodiments, gap 140 may be smaller than a grain size of TIM 80.

In various embodiments, device 100 may be made of, or may include, a material having greater thermal conductivity than that of the PCB 90 and/or electronic component 92. For example, device 100 may be made of, or may include, copper, tungsten, aluminum or any other materials know in the art.

Figure 2A:
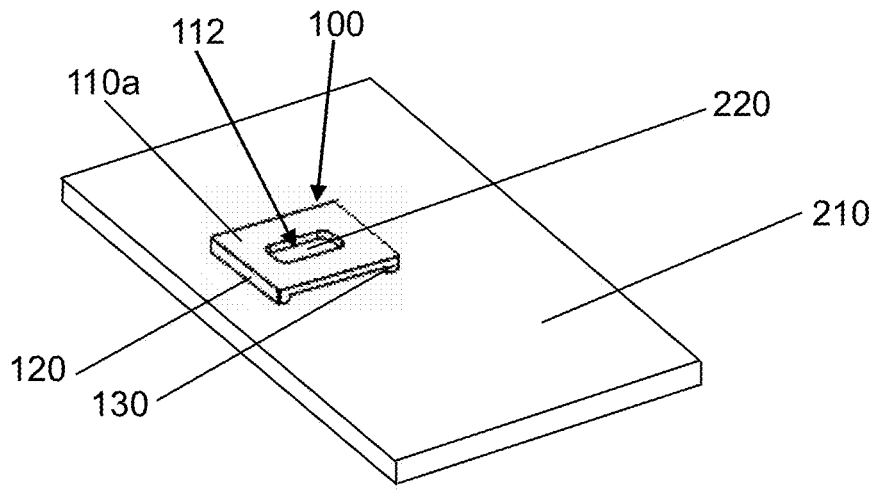
FIGS. 2A, 2B and 2C are 3D diagrams of an electronic assembly, according to some embodiments of the invention.
Figure 2B:
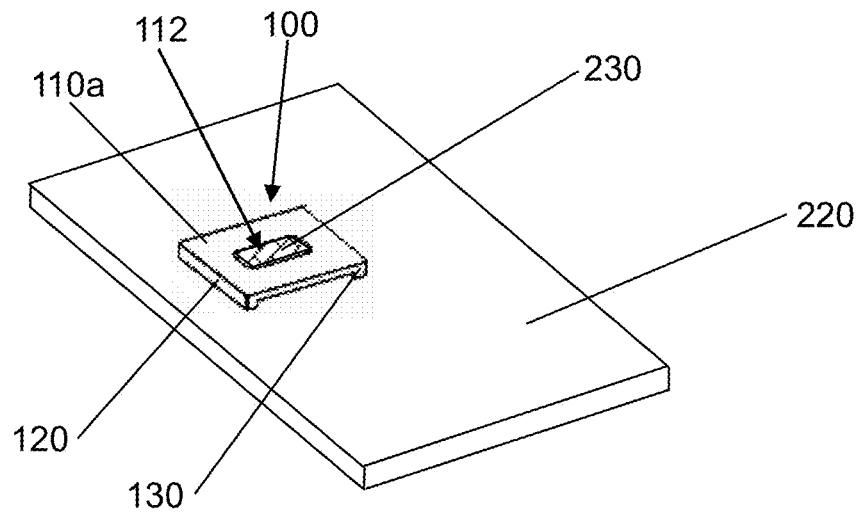
Figure 2C:
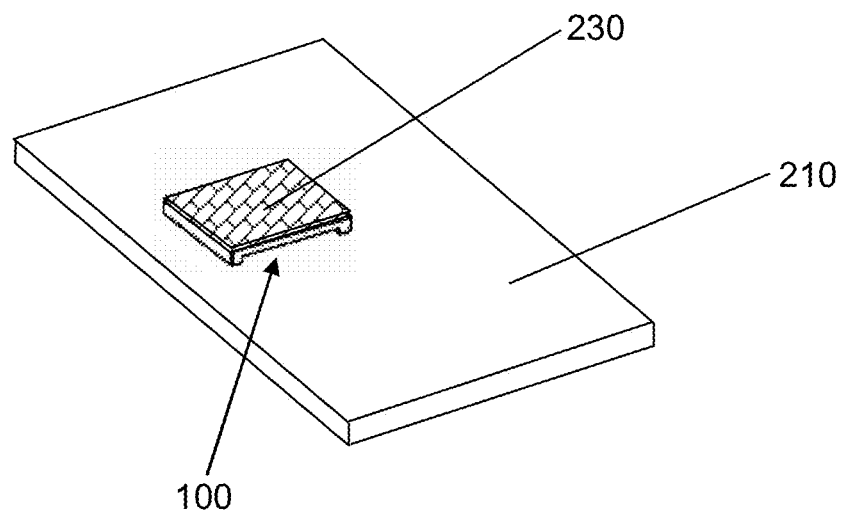

Reference is now made to FIGS. 2A, 2B and 2C, which are 3D diagrams of an electronic assembly 200, according to some embodiments of the invention.

According to some embodiments of the invention, electronic assembly 200 may include a PCB 210, an electronic component 220 (e.g., heat-producing electronic component), and device 100 (e.g., as described above with respect to FIGS. 1A, 1B, 1C, 1D, 1E, 1F and 1G), for example as shown in FIGS. 2A and 2B. TIM 230 may be disposed within an aperture 112 in surface 110 of device 100 to cover entire (or substantially entire) surface of electronic component 220 (e.g., as shown in FIG. 2B). In some embodiments, TIM 230 may cover at least a portion of surface 110 of device 100 (e.g., as shown in FIG. 2C). For example, TIM 230 may be contained within aperture 112, and not cover parts of device 100, or TIM 230 may be contained within aperture 112 and also cover all or part of upper portion 110a of surface 110 of device 100.

Figure 3A:
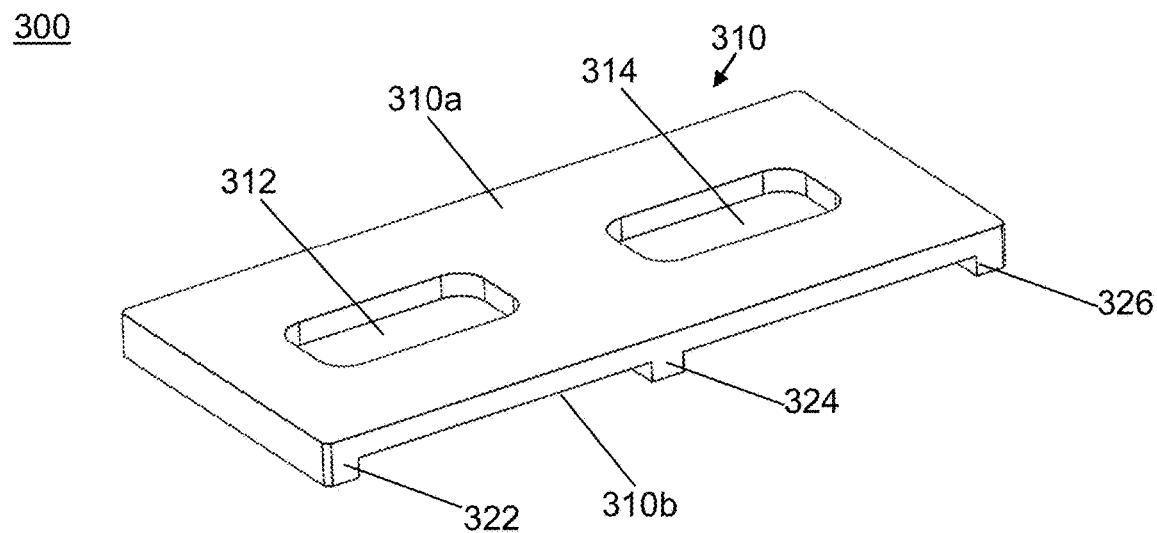
FIGS. 3A and 3B are 3D diagrams of a mechanical device for cooling electronic components, the device including two or more openings or apertures and two or more legs or supports, according to some embodiments of the invention.
Figure 3B:
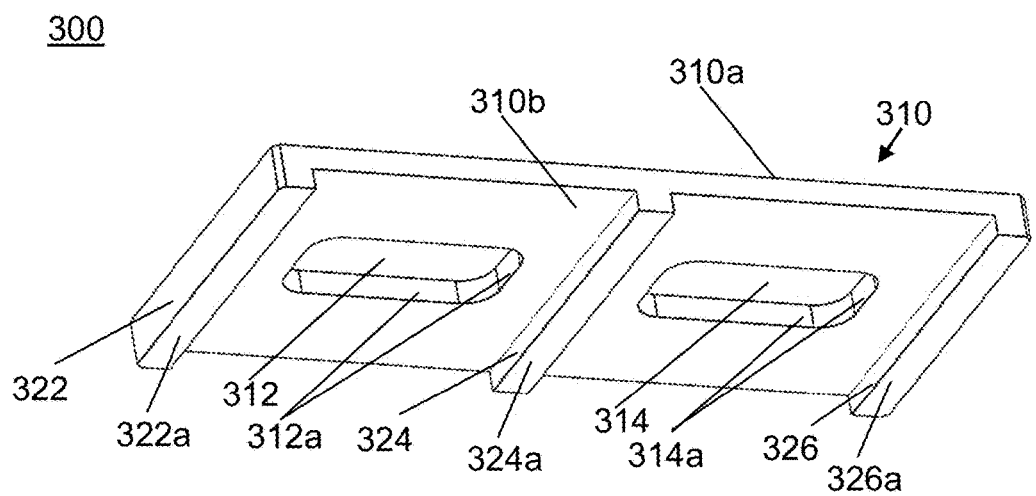

Reference is now made to FIGS. 3A and 3B, which are 3D diagrams of a mechanical device 300 for cooling electronic components, device 300 including two or more openings or apertures and two or more legs or supports, according to some embodiments of the invention.

According to some embodiments of the present invention, device 300 may include a surface 310 having two or more openings or apertures, and two or more legs or supports protruding from surface 310.

In the example shown in FIGS. 3A and 3B, surface 310 of device 300 includes a first aperture 312 and a second aperture 314, and device 300 includes a first support 322, a second support 324 and a third support 326.

Other numbers of apertures may be used. The number of apertures in surface 310 of device 300 and relative positions of the apertures with respect to each other in surface 310 may be determined based on number of electronic components on the PCB to be cooled with device 300 and relative positions of the electronic components with respect to each other on the PCB.

The apertures in surface 310 of device 300 may have the same shape or may have different shapes as other apertures on device 300. In the example shown in FIGS. 3A and 3B, both first aperture 312 and second aperture 314 have a rectangular (or substantially rectangular) shape. The shape of each of the apertures may correspond (or substantially correspond) to a shape of one of the electronic components on the PCB (e.g., a rectangular shape, a circular shape or any other shapes known in the art, as described hereinabove).

Surface 310 may include an upper portion 310a and a lower portion 310b. In some embodiments, upper portion 310a and lower portion 310b may be parallel (or substantially parallel) to each other. In some embodiments, surface 310 of device 300 may be flat (or substantially flat). Surface 310 may, for example, have a rectangular (or substantially rectangular) shape (e.g., as shown in FIGS. 3A and 3B), a circular (or substantially circular) shape, or other shapes known in the art (e.g., as described hereinabove).

Each of the apertures may include side walls perpendicular (or substantially perpendicular) to upper portion 310a and/or lower portion 310b of surface 310 such that each of the apertures with its side walls may act as a container for the TIM. In the example shown in FIGS. 3A and 3B, a first aperture 312 may include side walls 312a and second aperture 314 may include side walls 314a.

In some embodiments, the supports of device 300 may be perpendicular (or substantially perpendicular) to surface 310 of device 100. For example, as shown in FIGS. 3A and 3B, first support 322, second support 324 and third support 326 are perpendicular to surface 310 of device 300. In some embodiments, the supports of device 300 may protrude from lower portion 310b of surface 310 of device 300 (e.g., as shown in FIGS. 3A and 3B). In some embodiments, each of the apertures in surface 310 may be between two of the supports. For example, as shown in FIGS. 3A and 3B, first aperture 312 is between first support 322 and second support 324, and second aperture 314 is between second support 324 and third support 326.

The supports of device 300 may be connected to or placed on at their free ends (e.g., ends 322a, 324a, 326a of supports 322, 324, 236, respectively, that are not connected to surface 310) the PCB to align (or substantially align) each of the apertures in surface 310 of device 300 with the respective electronic component on the PCB (e.g., as described hereinabove). Upon connecting device 300 to or placing device 300 on the PCB, the TIM may be applied (e.g., dispensed) within the apertures in surface 310 of device 300 to cover the electronic components on the PCB (e.g., as described hereinabove).

Dimensions of the apertures in surface 310 of device 300 and dimensions of the supports of device 300 may be predetermined to prevent unintentional leak of the TIM onto the PCB during/upon application of the TIM within the apertures. In some embodiments, an area of each of the apertures may be smaller than the entire area of the surface of the respective electronic component on the PCB. In some embodiments, heights of the supports of device 300 (e.g., heights above the PCB) may be greater than heights of the electronic components on the PCB such that when device 300 is connected to the PCB, gaps are formed between surface 310 of device 300 and the electronic components (e.g., such as gap 140 described hereinabove). In some embodiments, the gaps may be smaller than the grain size of the TIM. In some embodiments, at least a portion of surface 310 of device 300 may be covered with the TIM (e.g., as described hereinabove).

In various embodiments, device 300 may be made of, or may include, a material having greater thermal conductivity than the PCB and/or the electronic components. For example, device 300 may be made of, or may include, copper.

Device 300 and/or the TIM disposed within the apertures in surface 310 and/or covering at least a portion of surface 310 of device 300 may cause heat to dissipate from the electronic components on the PCB to cool the electronic components. For example, heat may flow from the electronic components to the TIM and dissipate from the TIM to air and/or to a shell of an electronic assembly comprising device 300. In another example, e.g., if device 300 is made of a material having greater thermal conductivity than that of the PCB and/or the electronic components and/or the TIM, heat may flow from the electronic components and/or from the TIM to device 300 and dissipate from device 300 and the TIM to air and/or to a shell of an electronic assembly comprising device 300.

Figure 4:
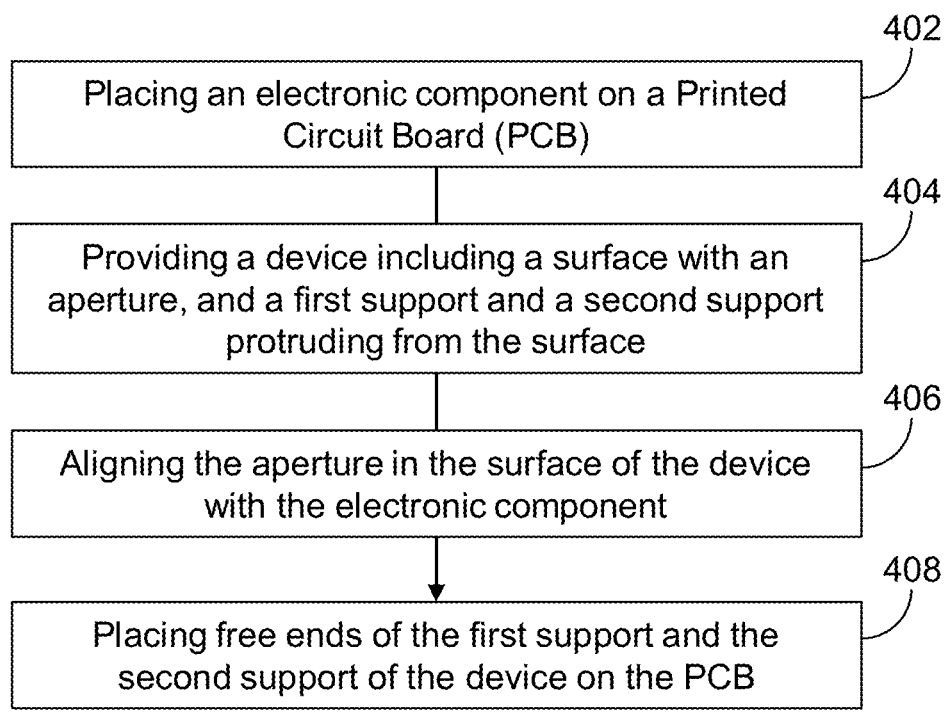
FIG. 4 is a flowchart of a method of assembling an electronic assembly, according to some embodiments of the invention.

Reference is now made to FIG. 4, which is a flowchart of a method of assembling an electronic assembly, according to some embodiments of the invention.

In operation 402, an electronic component may be connected to or placed on a Printed Circuit Board (PCB). For example, the heat-producing electronic component may be similar to electronic component 220 described above with respect to FIGS. 2A, 2B and 2C.

In operation 404, a device may be provided including a surface with an aperture, and a first support and a second support protruding from the surface. For example, the device, the surface, the aperture, the first support and the second support may be similar to device 100, surface 110, aperture 112, first support 120 and second support 130, respectively, as described above with respect to FIGS. 1A, 1B, 1C, 1D, 1E, 1F, 1G and FIGS. 2A, 2B and 2C.

In operation 406, the aperture in the surface of the device may be aligned with at least a portion of the electronic component (e.g., as described hereinabove).

In operation 408, free ends of the first support and the second support of the device may be connected to or placed on the PCB (e.g., as described hereinabove).

Some embodiments may further include applying the TIM within the aperture in the surface of the device (e.g., as described hereinabove).

Some embodiments may further include applying the TIM to at least a portion of (e.g., part of, half of, all of, etc.) the surface of the device (e.g., as described hereinabove).

Advantageously, the disclosed device may enable application of the TIM to heat-producing electronic components on the PCB while preventing unintended leakage of the TIM onto sensitive components on the PCB during/upon application of the TIM. The device and/or the TIM disposed within the apertures (e.g., within the surface area of the apertures, whether or not the TIM extends above the upper limit of the apertures) in the surface and/or covering at least a portion of the surface of the device may cause heat to dissipate from the electronic component on the PCB to cool the electronic component (e.g., as described hereinabove).

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A mechanical device for cooling an electronic component, the device comprising:
   a surface comprising an aperture; and
   a first support protruding from the surface and a second support protruding from the surface;
   a thermal interface material (TIM) disposed within the aperture;
   wherein a height of the first support and a height of the second support are greater than a height of the electronic component such that when the device is placed on a Printed Circuit Board (PCB), a gap is formed between the surface of the device and the electronic component;
   wherein the gap between the surface of the device and the electronic component is smaller than the grain size of the TIM to prevent unintentional leak of the TIM onto the PCB upon application of the TIM within the aperture.

2. The device of claim 1, wherein the first support and the second support are at opposite sides of the aperture with respect to each other.

3. The device of claim 1, wherein the first support and the second support are configured to contact at their free ends the PCB to align the aperture with at least a portion of the electronic component.

4. The device of claim 1, wherein a shape of the aperture substantially corresponds to a shape of the electronic component.

5. The device of claim 1, wherein an area of the aperture is smaller than an area of the electronic component.

6. The device of claim 1, comprising a material having greater thermal conductivity than the PCB.

7. An electronic assembly comprising:
a Printed Circuit Board (PCB);
an electronic component connected to the PCB;
a device comprising:
a surface comprising an aperture aligned with the electronic component, and
a first support protruding from the surface and a second support protruding from the surface and placed at their free ends on the PCB; and
a thermal interface material (TIM) disposed within the aperture of the device;
wherein the device is formed of a material having greater thermal conductivity than the PCB to cause heat to flow from the electronic component through the TIM to the device and dissipate from the device and the TIM to air or to a shell.

8. The electronic assembly of claim 7, wherein the first support and the second support of the device are at opposite sides of the aperture of the device with respect to each other.

9. The electronic assembly of claim 7, wherein a shape of the aperture of the device substantially corresponds to a shape of the electronic component.

10. The electronic assembly of claim 7, wherein an area of the aperture of the device is smaller than an area of the electronic component.

11. The electronic assembly of claim 10, wherein a height of the first support and a height of the second support of the device are greater than a height of the electronic component such that a gap is formed between the surface of the device and the electronic component.

12. The electronic assembly of claim 11, wherein the gap is smaller than a grain size of the TIM.

13. The electronic assembly of claim 7, wherein the TIM further covers at least a portion of the surface of the device.

14. A method of assembling an electronic assembly, the method comprising:
placing an electronic component on a Printed Circuit Board (PCB);
providing a device comprising:
a surface comprising an aperture configured to receive and hold in place a thermal interface material (TIM), and
a first support protruding from the surface and a second support protruding from the surface,
wherein a height of the first support and a height of the second support are greater than a height of the electronic component such that a gap is formed between the surface of the device and the electronic component;
aligning the aperture in the surface of the device with the electronic component; and
placing a free end of the first support and a free end of the second support of the device on the PCB;
applying the TIM within the aperture of the device;
wherein the gap between the surface of the device and the electronic component is smaller than the grain size of the TIM to prevent unintentional leak of the TIM onto the PCB upon application of the TIM within the aperture.

15. The method of claim 14, further comprising applying the TIM to at least a portion of the surface of the device.

* * * * *